United States Patent [19]

Konishi et al.

[11] 4,016,593
[45] Apr. 5, 1977

[54] BIDIRECTIONAL PHOTOTHYRISTOR DEVICE

[75] Inventors: Nobutake Konishi; Tsutomu Yatsuo; Tatsuya Kamei; Masahiro Okamura; Takuzo Ogawa, all of Hitachi, Japan

[73] Assignee: Hitachi, Ltd., Japan

[22] Filed: June 3, 1975

[21] Appl. No.: 583,406

[30] Foreign Application Priority Data

June 7, 1974 Japan .............. 49-64084

[52] U.S. Cl. .............. 357/38; 357/30; 357/39; 357/55
[51] Int. Cl.² .............. H01L 29/74
[58] Field of Search .............. 357/30, 38, 39, 55

[56] References Cited

UNITED STATES PATENTS

| | | | |
|---|---|---|---|
| 3,317,746 | 4/1967 | Hutson | 307/88.5 |
| 3,535,615 | 10/1970 | Horwell | 323/22 |
| 3,622,841 | 11/1971 | Zoroglu | 317/235 AA |
| 3,697,833 | 10/1972 | Nakata | 317/235 R |
| 3,893,153 | 7/1975 | Page | 357/38 |
| 3,896,477 | 11/1973 | Hutson | 357/39 |
| 3,908,187 | 9/1975 | Sheldon | 357/81 |
| 3,914,782 | 10/1975 | Nakata | 357/38 |

Primary Examiner—Martin H. Edlow
Attorney, Agent, or Firm—Craig & Antonelli

[57] ABSTRACT

A bidirectional photothyristor device comprises a semiconductive substrate including an NPNPN quintuple layer in which projections of both the outer layers Ns in the stacking direction are not overlapped so as to define two quadruple layer regions each having either one of the outer layers Ns as an end layer, a pair of main electrodes connecting the two quadruple layer regions in parallel relationship, a recess formed between the two quadruple layer regions within the semiconductive substrate and to which two intermediate P-N junctions are exposed, and means for applying a light trigger signal to the recess.

15 Claims, 9 Drawing Figures

BIDIRECTIONAL PHOTOTHYRISTOR DEVICE

BACKGROUND OF THE INVENTION

1. Field of the Invention

This invention relates to a bidirectional photothyristor device which performs a bidirectional switching operation in response to a light-trigger signal.

2. Description of the Prior Art

A bidirectional thyristor which, for example, exhibits bidirectional switching characteristics comprises a semiconductor substrate having five continuous layers of alternately different conductivity type and including two controlled rectifier regions, in parallel opposed arrangement, which comprise four layers and have an end layer respectively formed by one or the other of the two outer layers of the five continuous layers; a pair of main electrodes in ohmic contact with the outer layers and intermediate layers adjacent thereto; and means for supplying a trigger signal. In such a device, when a trigger signal is supplied in a state that a voltage is applied between the main electrodes so that the first of the main electrodes is at higher potential than the second and one controlled rectifier region is biased forwardly, that region begins to turn on. On the other hand, when a trigger signal is supplied in a state that a voltage is applied between the main electrodes so that the second main electrode is at higher potential than the first main electrode and the other controlled rectifier region is biased forwardly, that region begins to turn on.

The most common type of means for supplying a trigger signal is what is called the electric gate system in which one of the layers of the semiconductive substrate is provided with a gate electrode from which a gate signal current is supplied to perform a switching operation of the device. The electrical gate system, however, has the following disadvantages:

1. Provision of two gate electrodes is needed for a symmetrical bidirectional switching operation. This requires two gate circuits electrically isolated from each other.

2. In case of the provision of a single gate electrode, the gate electrode is located close to both the two quadruple layer regions, and at the same time a portion of the outer layer exposed to one principal surface opposite to the other principal surface on which the gate electrode is formed is located so that its projection in the stacking direction is partially overlapped with the gate electrode. Therefore, at an instant of commutating (during which conductive state is switched from one quadruple layer region to the other quadruple layer region), a possible switching of the conduction state will be caused before the application of a gate signal current, thereby resulting in a so-called erroneous firing.

3. In order to prevent interactions between the two quadruple layer regions, an isolation region is formed between the two quadruple layer regions by using intermediate triple layer regions so that projections of both the outer layers are spaced apart from each other by a predetermined distance. The isolation region thus formed requires the provision of two gate electrodes, resulting in the same disadvantage as item (1).

On account of these disadvantages of the electric gate system, application of the conventional bidirectional thyristors was limited to fields of applications requiring neither high reliability nor a high rated value of current or voltage, in spite of capability for the bidirectional switching operation.

On the other hand, a so-called light trigger system is being highlighted today. According to this system, a trigger signal undergoes conversion into a light signal and the light signal is irradiated on the semiconductive substrate to enable the switching operation. As compared with the electrical gate system, the light trigger system has the following advantages:

1. The two quadruple layer regions electrically isolated from each other can be fired by a single light source electrically isolated from these quadruple layer regions so that the provision of a single gate circuit is satisfactory.

2. Bidirectional thyristor circuits are electrically isolated from the gate circuit so that easy application of thyristors of this type is assured to high voltage circuits. The bidirectional thyristor with light trigger system, however, still has the following defects. In the first place, a problem arises from unbalance of firing sensitivity between the two quadruple layer regions. In firing the quadruple layer regions by means of a light trigger signal, the regions where carriers are generated for effective firing are located in the vicinity of the reverse-biased intermediate junctions. If the firing sensitivity is to be improved, the light trigger signal is required to be radiated so as to reach the vicinity of the intermediate junctions. In the case where the two quadruple layer regions are to be fired by light radiated from one of the main surfaces of the semiconductor substrate, the distance between the light-receiving surface and the reverse-biased intermediated junctions where carriers effective for firing the quadruple layer regions are generated is different for the two quadruple layer regions by the thickness of the intermediate layer of the quintuple layers. In other words, light required for firing the quadruple layer region having an intermediate junction farther from the light receiving surface is attenuated as an exponential function by being absorbed into the intermediate layer, with the result that the light-firing sensitivity of that particular quadruple layer region is much lower than that of the quadruple layer region having the intermediate junction nearer to the light-receiving surface. To eliminate such unbalance between firing sensitivities, one measure will be taken in which light is irradiated on the side edge surface connecting the pair of opposite principal surfaces of the semiconductive substrate or another measure in which light is irradiated on both the opposite principal surfaces. Thus, a second problem arises. Namely, in accordance with the above one measure, for assuring the firing it is necessary to provide a light source of large irradiation area or two light sources, and in accordance with said another measure, not only two light sources are needed but also incorporation of two light sources encounters difficulties in view of the device structure. More particularly, in the former case, althrough electron-positive hole pairs are created by the light irradiation at an interface at which the two quadruple regions adjoin, these carriers will not flow into the outer layers but mainly will be transferred to the main electrodes from the intermediate layers without participating in the firing because the bidirectional thyristor is so constructed that the outer layer and an intermediate layer next thereto are short-circuited by the main electrode. Accordingly, in order that the bidirectional thyristor is fired by a light trigger signal, it is necessary to apply the light trigger signal to each of the quadruple layer regions at a portion remote from the interface between the two quadruple layer regions. Light is received at two or more points on the side surface, thus requiring a light source of large capacity having a large radiating area or two or more light sources. In the third place, prevention of the erroneous firing at commutating instant degrades the firing sensitivity or requires two light sources. In the bidirectional thyristor, an unfavorable phenomenon takes place that during so-called commutating in which one quadruple layer region is switched from conduction state to non-conduction state while the other quadruple layer region is switched from non-conductive state to conduction state, residual storage carriers of the one quadruple layer region interacts with the said other quadruple layer region with the result that the latter quadruple layer region is fired before a trigger signal is applied. To solve this problem, it has been known to form an isolation region devoid of the function of quadruple layer region between both the quadruple layer regions and to distribute a heavy metal atom substance on the isolation region to save the semiconductive substrate surface by reducing the width of the isolation region. With this construction, however, because of a short lifetime of carriers within the isolation region and for the reasons as mentioned above, there is need for the provision, for each of the quadruple layer regions, of light sources for trigger signals which are located remote from the isolation region. Present-day techniques have difficulties with distributing heavy metal substance only on the isolation region when the semiconductive substrate is relatively thick and usually, the heavy metal substance is distributed over the whole surface of semiconductive substrate. Accordingly, even if a light trigger signal is applied to any portion, short lifetime carriers fail to enable the firing unless the quantity of light is increased. On account of the above disadvantages, although rather superior to the electric trigger system, the light trigger system is not employed for triggering bidirectional thyristors of high blocking voltage and large current capacity.

SUMMARY OF THE INVENTION

An object of the invention is to provide a novel bidirectional photothyristor device capable of manifesting symmetrical bidirectional current versus voltage characteristics with a light trigger signal irradiated from a single light source to a portion of a semiconductive substrate, and having substantially the equal bidirectional light firing sensitivities.

Another object of the invention is to provide a novel bidirectional photothyristor device free from an erroneous firing at an instant of commutating.

Another object of the invention is to provide a novel bidirectional photothyristor device applicable to high blocking voltage and large current capacity circuits.

To attain these objects, according to the invention, there is provided a bidirectional photothyristor device characterized in that between two opposite polarity thyristor parts a recess is formed to which ends of intermediate junctions of respective thyristor parts are exposed, and a light trigger signal is irradiated on the recess surface. Thus, a bidirectional photothyristor device is realized which can have substantially the equal bidirectional light firing sensitivities under the application of a light trigger signal from a single light source. A bidirectional photothyristor device according to the invention is further characterized in that between two opposite polarity thyristor parts an isolation region is formed which electrically separates both the thyristor parts. Thus, a bidirectional photothyristor device is realized which can have high commutating rate, a high blocking voltage and a large current capacity.

DESCRIPTION OF THE PREFERRED EMBODIMENTS

Figure 1:
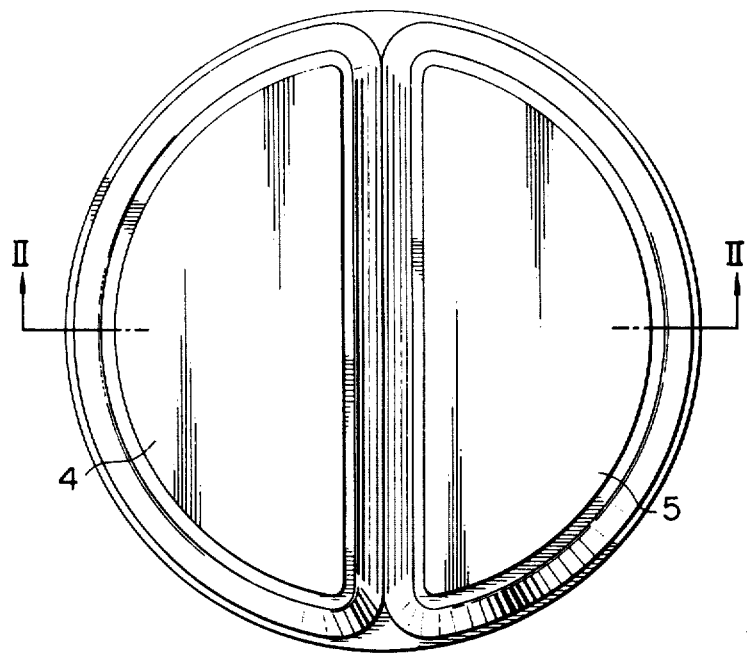
FIG. 1 is a plan view of a first embodiment of a bidirectional photothyristor device according to the invention.
Figure 2:
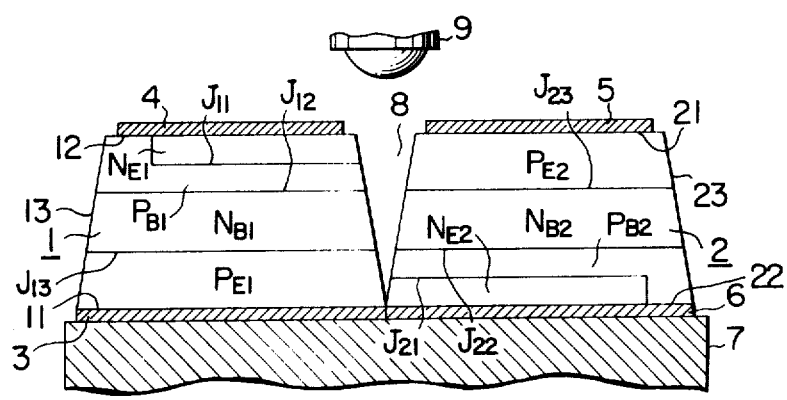
FIG. 2 is a sectional view taken along line II—II of FIG. 1.

Referring now to FIGS. 1 and 2, a first embodiment of a bidirectional photothyristor device according to the invention will be described. In the figures, numeral 1 generally designates a first semiconductive substrate part defined by a pair of opposite principal surfaces 11 and 12 and a side edge surface 13 bridging across the principal surfaces which comprises between the two principal surfaces four layers $N_{E1}$, $P_{B1}$, $N_{B1}$ and $P_{E1}$ stacked in the form of alternate laminations of different conductivities with P-N junctions formed between adjacent layers, 2 a second semiconductive substrate part defined by a pair of opposite principal surfaces 21 and 22 and a side edge surface 23 bridging across the principal surfaces which comprises between the two principal surfaces four layers $N_{E2}$, $P_{B2}$, $N_{B2}$ and $P_{E2}$ stacked in the form of alternate laminations of different conductivities with P-N junctions formed between adjacent layers, 3 an anode electrode in ohmic contact with the layer $P_{E1}$ at one principal surface of the first semiconductive substrate part 1, 4 a cathode electrode in ohmic contact with the layers $N_{E1}$ and $P_{B1}$ at the other principal surface of the first semiconductive substrate part 1, 5 an anode electrode in ohmic contact with the layer $P_{E2}$ at one principal surface of the second semiconductive substrate part 2, and 6 a cathode electrode in ohmic contact with the layers $N_{E2}$ and $P_{B2}$ at the other principal surface of the semiconductive substrate part 2. Although not illustrated, the cathode 4 and the anode 5 are electrically connected with each other. Numeral 7 designates an auxiliary supporting plate on which the first and second semiconductive substrate parts are carried in close proximity and in opposite polarity i.e. with the bottom anode electrode 3 for the first semiconductive substrate part 1 and with the bottom cathode electrode 6 for the second semiconductive substrate part 2. The side edge surface 13 of the first semiconductive substrate part is so inclined with respect to the principal surfaces that the principal surface 11 provided with the anode electrode 3 has a larger area than that of the principal surface 12 provided with the cathode electrode 4. Similarly, the side edge surface 23 of the second semiconductive substrate part 2 is so inclined with respect to the principal surfaces that the principal surface 22 provided with the cathode electrode 6 has larger area than that of the principal surface 21 provided with the anode electrode 5. Therefore, a V-shaped groove is formed between the first and second semiconductive substrate parts. Exposed at portions of the side edge surfaces defining the groove 8 are all of the P-N junctions. Numeral 9 designates a source emanating a light trigger signal to be irradiated on the surface of V-shaped groove 8 in part. As the light source 9, use will be made to a solid light emitting element such as light emitting diode located close to the semiconductive substrate parts, a window provided for the package for housing the device through which a light from an external light source is irradiated, or a photoconductive member, for example fiberscope, through which a light is irradiated. It is noted that in the figures a passivation film for stably protecting the surfaces of the semiconductive substrate parts and a package for housing the device are not illustrated.

A bidirectional photothyristor device with construction herein described may be manufactured either by performing the formation of the two quadruple layer regions on the same semiconductive substrate in opposite polarity and then the subsequent formation of groove 8 between both the regions or by performing independent formations of the first and second semiconductive substrate parts 1 and 2 and then subsequent juxtaposition of these parts on an auxiliary supporting plate. In view of identification of characteristics between the two semiconductive substrate parts (thyristor parts) and manufacturing efficiency, the former process will be recommended.

In operation, firstly, when applied with a voltage which assumes a negative potential at the electrode 4 relative to the electrode 3, the first semiconductive substrate part is biased so that forward biases are for a P-N junction $J_{11}$ between the layers $N_{E1}$ and $P_{B1}$ and a P-N junction $J_{13}$ between the layers $N_{B1}$ and $P_{E1}$ while a reverse bias is for a P-N junction $J_{12}$ between the layers $P_{B1}$ and $N_{B1}$. With simultaneous application of this voltage across the electrodes 5 and 6, the electrode 5 assumes a negative potential relative to the electrode 6 and the second semiconductive substrate part is biased so that a forward bias is for a P-N junction $J_{22}$ between the layers $P_{B2}$ and $N_{B2}$ while reverse biases are for a P-N junction $J_{21}$ between the layers $N_{E2}$ and $P_{B2}$ and a P-N junction $J_{23}$ between the layers $N_{B2}$ and $P_{E2}$. Under these conditions, when a light which stands for a trigger signal from the light source 9 is irradiated on the surface of the groove 8, the first semiconductive substrate part which has been brought into a forward blocking state is fired. The following is an explanation on the mechanism of this firing. The irradiation of light creates a number of electron-positive hole pairs, and the electrons and positive holes thus created are collected into the $N_{B1}$ layer and the layer $P_{B1}$, respectively. Positive holes collected in the layer $P_{B1}$ cause the potential at the layer $P_{B1}$ to decrease gradually and at the time that a voltage developing at the righthand end of the P-N junction $J_{11}$ exceeds a built-in voltage, an injection of electrons is started from layers $N_{E1}$ to $P_{B1}$ within the righthand end. Electrons injected into the layer $P_{B1}$ will diffuse into the layer $N_{B1}$ via P-N junction $J_{12}$. The diffused electrons raise the potential at the layer $N_{B1}$ with the result that when a bias voltage developing at the P-N junction $J_{13}$ exceeds a built-in voltage, an injection of positive holes is caused from layers $P_{E1}$ to $N_{B1}$. The injected positive holes will diffuse into the layer $P_{B1}$ from the layer $N_{B1}$ to forward bias the P-N junction $J_{11}$. This enhances the injection of electrons from layer $J_{11}$. This enhances the injection of electrons from layer $N_{E1}$. The above operation is repeated until the sum of the current amplification factors $\alpha_{PNP} + \alpha_{NPN}$ of the regions in terms of transistor exceed unity with one quadruple layer region of layers $N_{E1}$, $P_{B1}$, $N_{B1}$ and $P_{E1}$ rendered conductive.

Then, when a positive potential is applied to the electrodes 4 and 5 relative to the electrodes 3 and 6, the second semiconductive substrate part is brought into a forward blocking state and followed by a similar repeating operation with the other quadruple layer region of layers $N_{E2}$, $P_{B2}$, $N_{B2}$ and $P_{E2}$ rendered conductive.

As can be seen from the foregoing description, the bidirectional thyristor device according to the invention comprises between two semiconductive substrate parts a groove to which respective intermediate P-N junctions $J_{12}$ and $J_{22}$ are exposed and on which a light as a trigger signal is irradiated for permitting respective semiconductive substrate parts to undergo switching operation and it, therefore, assures a switching operation with substantially the equal bidirectional firing sensitivity by means of an identical light source. Moreover, the two semiconductive substrate parts isolated from each other by the groove formed therebetween prevents an erroneous firing due to residual carriers at an instant of commutating, giving rise to a high blocking voltage during commutating. The blocking voltage at commutating is further improved by eliminating an erroneous firing due to residual carriers at an instant of commutating through the construction wherein the side edge surfaces to which the P-N junctions for providing blocking voltages of respective semiconductive substrate parts are exposed are inclined with respect to these P-N junctions. The inclined side edge surfaces with respect to the P-N junctions also improve the blocking voltage ability of the bidirectional thyristor device. Furthermore, since the light trigger signal is applied to the side edge surfaces in part, the entire principal surface is saved for mounting of the electrodes and a full use of the semiconductive substrate is ensured to offer a compact and large current capacity bidirectional photothyristor device.

Figure 3:
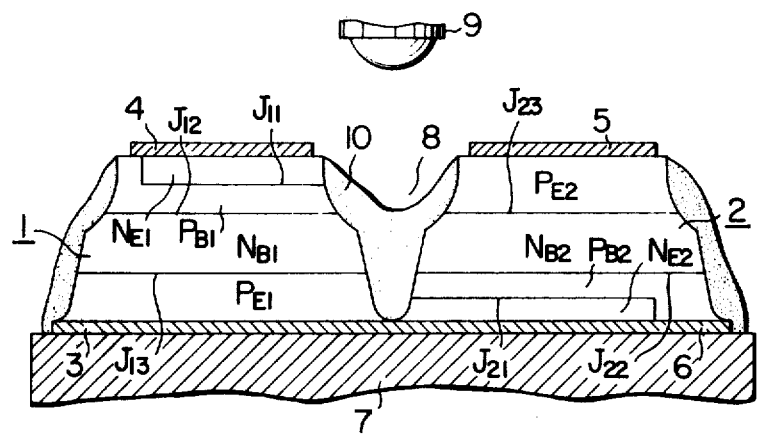
FIG. 3 is a sectional view of a second embodiment of the invention.

Turning now to FIG. 3, a second embodiment of bidirectional photothyristor device of the invention will be described wherein a higher blocking voltage is realized than the first embodiment. Like members are designated at the same reference numerals as the preceding embodiment. As one measure for improving the blocking voltage capacity of semiconductive devices, so-called bevelling has been known in which side edge surfaces of a semiconductive substrate to which P-N junctions are exposed are inclined with respect to these P-N junctions. Bevelling is classified into positive bevelling and negative bevelling. In accordance with positive bevelling, the side edge surfaces are inclined in such a manner that a sectional area on one side of high impurity concentration of a P-N junction and parallel therewith is larger than a sectional area on the other side; and in accordance with negative bevelling, the side edge surfaces are inclined conversely. It is also known that, for attaining an identical blocking voltage ability, the angle between the side edge surface and the P-N junction (bevelling angle) must be smaller than for positive bevelling. The side edge surfaces inclined at a constant bevelling angle, as shown in the first embodiment, the P-N junctions $J_{12}$ and $J_{23}$ realize a negative bevelling. The P-N junctions $J_{12}$ and $J_{23}$ in the first embodiment rather reduce the blocking voltage of the device. In the second embodiment, on the other hand, bevelling angle for P-N junctions $J_{12}$ and $J_{23}$ corresponding to a negative bevelling is made smaller than that for P-N junctions $J_{13}$ and $J_{22}$ corresponding to a positive bevelling so that the blocking voltage for negative bevelling P-N junctions is approximated to that for positive bevelling P-N junctions, thereby improving the blocking voltage property of the device. A groove shaped for this purpose can be formed through sandblast process, but more preferably through an etching process. With an etching process, a shallow groove is firstly formed for the purpose of a negative bevelling and then a deep groove is formed for a positive bevelling. The side edge surfaces are covered with insulation material 10, for example silicon rubber or glass.

Figure 4:
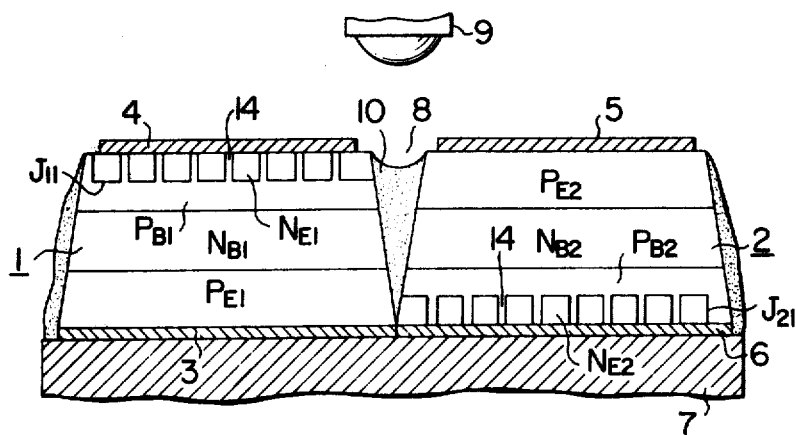
FIG. 4 is a sectional view of a third embodiment of the invention.

Turning to FIG. 4, a third embodiment of a bidirectional photothyristor device of the invention will be described which has a higher $dv/dt$ property than and superior temperature characteristics to the first and second embodiments. In the first and second embodiments, the P-N junctions $J_{11}$ and $J_{21}$ are short-circuited to the electrodes at their end portions, but with this construction elimination of the influence of the displacement current and reverse leakage current (erroneous firing) is not satisfactory. To solve this problem, the third embodiment comprises layers $N_{E1}$ and $N_{E2}$ formed with short-circuit paths 14 to the electrodes distributed substantially uniformly over the entire surfaces of these layers. Through spaces between the short-circuit paths 14, layers $P_{B1}$ and $P_{B2}$ extend to be exposed to the one principal surface. In other words, P-N junction $J_{11}$ is short-circuited to the cathode electrode 4 in substantially equal spacing over the entire surface of the layer $N_{E1}$, and P-N junction $J_{21}$ is short-circuited to the cathode electrode 6 in substantially equal spacing over the entire surface of the layer $N_{E2}$. With this construction, it is possible to satisfactorily eliminate the influence of the displacement current and the reverse leakage current and thus it is possible to obtain a bidirectional photothyristor device with an improved $dv/dt$ capability and stable temperature characteristics. It should be noted that like reference numerals are designated to like members of the preceding embodiments and that groove 8 may be formed in a similar manner to the second embodiment.

Figure 5:
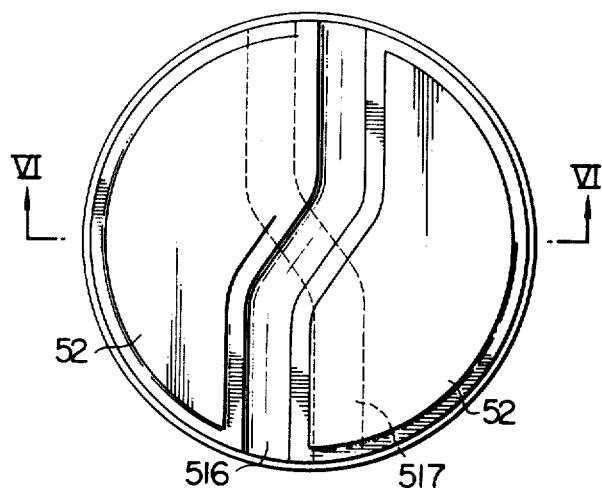
FIG. 5 is a plan view of a fourth embodiment of the invention.
Figure 6:
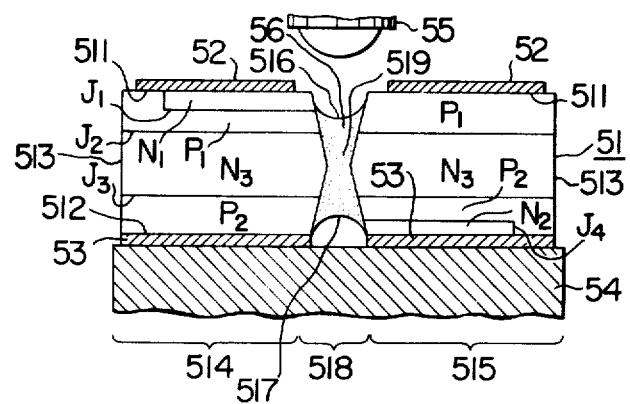
FIG. 6 is a sectional view taken along line VI—VI of FIG. 5.

Turning to FIGS. 5 and 6, a fourth embodiment of a bidirectional photothyristor device according to the invention will be described which is more suitable for mass production than the preceding embodiments. Constructionally, the fourth embodiment is the same as the foregoing embodiments except that first and second semiconductive substrates parts are formed integrally. In the figures, numeral 51 generally designates a semiconductive substrate which comprises a pair of opposite principal surfaces 511 and 512, a side edge surface 513 bridging the two principal surfaces, and five layers $N_1$, $P_1$, $N_3$, $P_2$ and $N_2$ formed between the principal surfaces and stacked in the form of alternate laminations of different conductivities with P-N junctions formed between adjacent layers. While one principal surface 511 consists of an exposed surface of the layer $P_1$ and an exposed surface of the layer $N_1$ formed within the layer $P_1$, the other principal surface 512 consists of an exposed surface of the layer $P_2$ and an exposed surface of the layer $N_2$ formed within the layers $P_2$. The layers $N_1$ and $N_2$ formed within the layers $P_1$ and $P_2$, respectively, are spaced by a predetermined distance such that projections of these layers $N_1$ and $N_2$ in the stacking direction are not overlapped. In this manner, the semiconductive substrate 51 is formed with a quadruple layer region 514 having one end layer $N_1$, a quadruple layer region 515 having one end layer $N_2$, and an isolated region 518 of layers $P_1$, $N_3$ and $P_2$ interposed between both the quadruple layer regions 514 and 515. The quadruple layer regions 514 and 515 respectively correspond to the first and second semiconductive substrate parts of the preceding embodiments. Numerals 516 and 517 designates grooves respectively formed from the principal surfaces 511 and 512 within the isolated region 518. Each of the grooves 516 and 517 has a depth smaller than the thickness of semiconductive substrate 51 but larger than half the thickness thereof and partially intersect with each other. Numeral 519 designates a through-hole resulting from the intersection of grooves 516 and 517. Numerals 52 and 53 designate a pair of main electrodes which are in ohmic contact with layers $N_1$ and $P_1$ and with layers $N_2$ and $P_2$, respectively. The main electrode 52 is divided into two portions by groove 516, but these portions are electrically connected through a suitable means. Similarly, the main electrode 53 which is also divided into two portions by groove 517 is integral electrically. Numeral 54 designates an auxiliary supporting plate on which the semiconductive substrate 51 is mounted, 55 a light source opposed to the through-hole 519 which emanates a light trigger signal, and 56 insulation material of high light transmissivity filled in the through-hole 519, for example epoxy resin.

In a bidirectional photothyristor device of this construction, the isolated region 518, grooves 516 and 517 and through-hole 519 serve in cooperation with one another as the groove 8 of the foregoing embodiments and therefore, the same effect as the foregoing embodiments are achieved. This fourth embodiment differs from the preceding embodiments, as mentioned earlier, in that physically the semiconductive substrate is not divided into the first and second semiconductive substrate parts. In manufacturing semiconductor devices, it is a general practice for improving the manufacturing efficiency an attaining uniform characteristics that a semiconductive plate of wide surface area is at first subjected to diffusion, passivation and electrode forming treatments and thereafter it is divided into a number of semiconductive substrates. Where the preceding embodiments are practiced through such process, the positioning of the two semiconductive substrate parts encounters difficulties if the semiconductive substrate parts which have already been formed with the groove configuration are mounted on the auxiliary supporting plate whereas complicated steps are needed if the semiconductive substrate parts which have already been mounted on the auxiliary supporting plate are formed with the groove. In accordance with this fourth embodiment, on the contrary, since the integral semiconductive substrate is mounted on the auxiliary supporting plate, the above general manufacturing process can preferably be applied to this embodiment and it assures mass production of the devices. Preferably, the through-hole 519 is filled with light transmissible insulation material in order that the light sensitivity is improved and exposed portions of the P-N junctions are stabilized. It is noted that the fourth embodiment may be so modified as to improve the $dv/dt$ capability and temperature characteristics.

Figure 7:
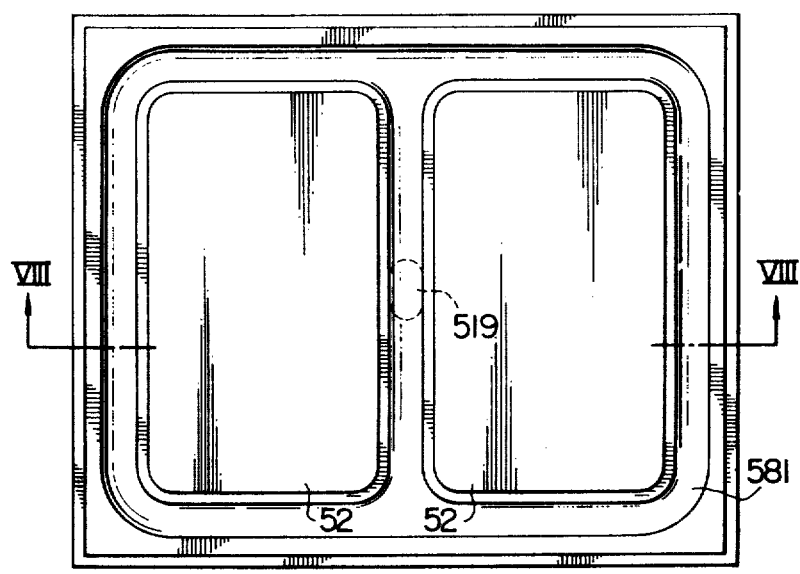
FIG. 7 is a plan view of a fifth embodiment of the invention.
Figure 8:
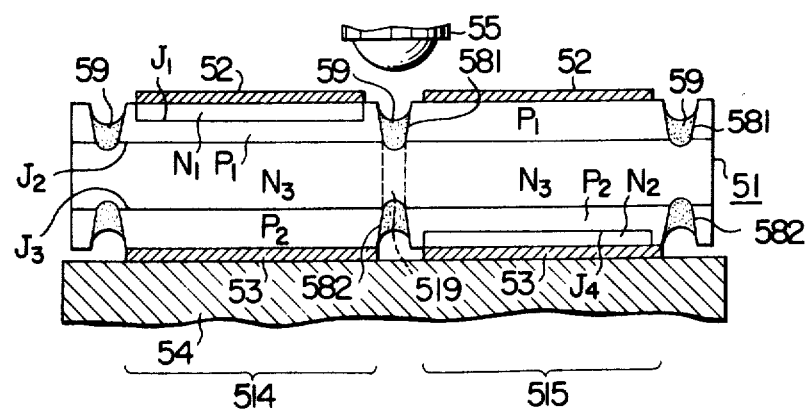
FIG. 8 is a sectional view taken along line VIII—VIII of FIG. 7.

Turning to FIGS. 7 and 8, a fifth embodiment of bidirectional photothyristor device of the invention will be described which has a high blocking voltage and is suitable for mass production. As shown in FIGS. 7 and 8, a deep groove 581 is formed in one principal surface, which groove is depressed beyond a P-N junctions $J_2$ surrounds quadruple layer regions 514 and 515. Similarly, a deep groove 582 is formed in the other principal surface, which groove is depressed beyond a P-N junction $J_3$ and surrounds the quadruple layer regions 514 and 515. A through-hole 519 is formed in central leg portions of these grooves between the quadruple layer regions 514 and 515. Numeral 59 designates insulation material of high light transmissivity filled in the grooves and the through-hole. With this construction, exposed ends of the P-N junctions $J_2$ and $J_3$ are bevelled so that an integral semiconductive substrate of large surface area provided with bevelling on both the principal surfaces can be manufactured and a bidirectional photothyristor device of high blocking voltage suitable for mass production can be obtained. It is noted that this embodiment can be modified to have a similar construction to the third embodiment. Although, in this embodiment, the semiconductive plate of wide area is cut at a portion other than the groove so as to be divided into the semiconductive substrate parts in consideration of the use of glass for the insulation material 59, the semiconductive plate may be cut at the groove.

Figure 9:
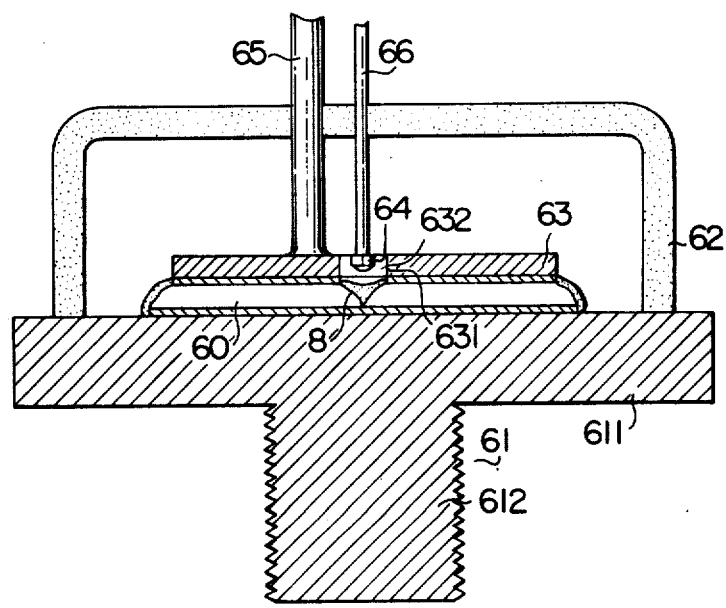
FIG. 9 is a sectional view of a sixth embodiment of the invention.

Turning to FIG. 9, a sixth embodiment of a bidirectional photothyristor device of the invention will be described in which the device in accordance with the second embodiment is incorporated in a container. In the figure, numeral 61 designates a mounting base consisting of a plate 611 on which a semiconductive substrate 60 is carried and a screwed projection 612 to which cooling fins, for example, are mounted, 62 a cup-shaped insulator by which an air-tight container for housing the semiconductive substrate 60 is built. Numeral 63 designates an electrode plate carried on the semiconductive substrate 60, 631 a through-hole formed in the electrode plate 63 and communicating with a groove 8 in the semiconductive substrate 60, 64 a light emitting element supported in the through-hole 631 by means of insulation material 632, and 65 and 66 leads connected to the electrode plate 63 and the light emitting element 64, respectively.

The effect brought about by the invention will now be described with reference to experimental data. A trial bidirectional photothyristor device of 800 volt rating voltage and 100 ampere rating current was manufactured in terms of the embodiment shown in FIG. 3. The semiconductive substrate was 1.6 cm in diameter, 350 $\mu$ in thickness and formed with the groove of 2.2 mm upper end width. The trial device performed a bidirectional switching operation by a light trigger signal from a 0.1 W (10 mW light output) semiconductor light emitting element, and manifested critical commutating rate of rise of off-state voltage $dv/dt > 100V/\mu s$ under critical commutating rate of rise of on-state current $dv/dt = 100A/\mu s$. On the other hand, a bidirectional photothyristor of 200 volt rating voltage and 3 ampere rating current with electric gate system requires 3.5 V × 300 mA gate power to perform a bidirectional switching operation and manifests critical commutating rate of rise of off-state voltage $dv/dt = 20V/\mu s$ under critical commutating rate of rise of on-state current $di/dt = 1A/\mu s$ at an instant of commutating. This device is provided with about 1 mm width isolation region formed between two thyristors.

What is claimed is:
1. A bidirectional photo thyristor device comprising:
a semiconductor substrate having first and second principal surfaces opposite to one another and a side surface extending from said first principal surface to said second principal surface, said substrate including first and second substrate portions, each of which includes
a first semiconductor layer of a first conductivity type one surface of which extends to said first principal surface,
a second semiconductor layer of a second conductivity type, opposite said first conductivity type, disposed in contact with and defining a first PN junction with said first semiconductor layer, and
a third semiconductor layer of said first conductivity type, disposed in contact with and defining a second PN junction with said second semiconductor layer, one surface of said third semiconductor layer extending to the second principal surface of said substrate;
said first substrate portion further including a fourth semiconductor layer of said second conductivity type formed in a first surface portion of said one surface of said first semiconductor layer and defining therewith a fourth PN junction which extends to said first principal surface of said substrate;
said second substrate portion further including a fifth semiconductor layer of said second conductivity type formed in a first surface portion of said one surface of said third semiconductor layer and defining therewith a fifth PN junction which extends to said second principal surface of said substrate;
said substrate further including a recess extending from said first principal surface toward said second principal surface and being disposed between the first and second substrate portions of said substrate so as to expose said first and second semiconductor layers;
first main electrode means disposed upon the first principal surface of said substrate so as to be in contact with said first and fourth semiconductor layers of said first substrate portion and the first semiconductor layer of said second substrate portion;
second main electrode means, disposed upon the second principal surface of said substrate so as to be in contact with the third semiconductor layer of said first substrate portion and the third and fifth semiconductor layers of said second substrate portion; and
means for illuminating the surfaces of said first and second substrate portions which are exposed by said recess with a light trigger signal for controlling switching operations of said first and second substrate portions.

2. A bidirectional photo thyristor according to claim 1, wherein said recess separates said substrate into said first and second substrate portions and comprises a V-shaped groove the sides of which converge from said first principal surface to said second principal surface, said illuminating means being disposed adjacent to, but spaced apart from, the opening of said V-shaped groove at said first principal surface.

3. A bidirectional photo thyristor according to claim 1, wherein said recess separates said substrate into said first and second substrate portions and is so formed that the sides of said first and second substrate portions defining said recess are bevelled.

4. A bidirectional photo thyristor according to claim 3, wherein the shape of said bevelled recess is such that as one traverses the recess from said first principal surface of said substrate to the second principal surface of said substrate, the cross sectional area of said substrate in a plane parallel to said first principal surface increases.

5. A bidirectional photo thyristor according to claim 1, wherein the sides of the first and second substrate portions defining said recess are concave.

6. A bidirectional photo thyristor according to claim 4, wherein said side surface of said substrate is bevelled.

7. A bidirectional photo thyristor according to claim 1, wherein said recess separates said substrate into said first and second substrate portions and has a first sloping portion extending from said first principal surface of said substrate and a second sloping portion, steeper than said first sloping portion, extending from said first sloping portion toward said second principal surface of said substrate, so that said first and third PN junctions extend to said first sloping portion, and said second and fourth PN junctions extend to said second sloping portion.

8. A bidirectional photo thyristor according to claim 2, wherein each of said fourth and fifth semiconductor layers has a plurality of slots therethrough extending to said first and second principal surfaces of said substrate, respectively, the semiconductor material of said first and third semiconductor layers extending through said slots to said first and second principal surfaces of said substrate, respectively.

9. A bidirectional photo thyristor according to claim 8, wherein said recess separates said substrate into said first and second substrate portions and comprises a V-shaped groove the sides of which converge from said first principal surface to said second principal surface, said illuminating means being disposed adjacent to, but spaced apart from, the opening of said V-shaped groove at said first principal surface.

10. A bidirectional photo thyristor according to claim 9, wherein the side surface of said substrate is sloped so that as one traverses from the first principal surface of said substrate to the second principal surface thereof, the cross-sectional area of said substrate in a plane parallel to said first principal surface increases.

11. A bidirectional photo thyristor according to claim 1, wherein said recess contains light transmissive solid material.

12. A bidirectional photo thyristor according to claim 1, wherein said illuminating means comprises a semiconductor light emitting element disposed adjacent to, but spaced apart from, the opening of said recess at said first principal surface.

13. A bidirectional photo thyristor according to claim 1, wherein said substrate further includes an additional recess extending from said second principal surface toward said first principal surface and being disposed between said first and second substrate portions of said substrate, and wherein said recesses follow meandering paths along the first and second principal surfaces of said substrate and intersect each other so that a through-hole extending from said first principal surface to said second principal surface is formed at the intersection of said recesses.

14. A bidirectional photo thyristor according to claim 1, wherein said substrate further includes a first groove surrounding said first and second substrate portions and intersecting said recess, said recess and said first groove extending from said first principal surface toward said second principal surface to a depth exceeding the thickness of said first semiconductor layer.

15. A bidirectional photo thyristor according to claim 14, wherein said substrate further includes an additional recess and a second groove surrounding said first and second substrate portions and intersecting said additional recess, said additional recess and said second groove extending from said second principal surface toward said first principal surface to a depth exceeding the thickness of said third semiconductor layer.

* * * * *